(12) United States Patent
Kurashima et al.

(10) Patent No.: US 7,844,226 B2
(45) Date of Patent: Nov. 30, 2010

(54) ELECTRONIC APPARATUS AND METHOD OF MANUFACTURING ELECTRONIC APPARATUS

(75) Inventors: Shigemi Kurashima, Shinagawa (JP); Masahiro Yanagi, Shinagawa (JP); Hideki Iwata, Shinagawa (JP); Takashi Yuba, Shinagawa (JP); Masahiro Kaneko, Shinagawa (JP); Yuriko Segawa, Shinagawa (JP); Takashi Arita, Shinagawa (JP)

(73) Assignee: Fujitsu Component Limited, Tokyo (JP)

( * ) Notice: Subject to any disclaimer, the term of this patent is extended or adjusted under 35 U.S.C. 154(b) by 964 days.

(21) Appl. No.: 11/604,377

(22) Filed: Nov. 27, 2006

(65) Prior Publication Data
US 2007/0231937 A1 Oct. 4, 2007

(30) Foreign Application Priority Data
Mar. 29, 2006 (JP) ............................. 2006-091604

(51) Int. Cl.
*H04B 17/00* (2006.01)
(52) U.S. Cl. .............. 455/67.11; 455/67.14; 455/456.1; 455/423; 235/451
(58) Field of Classification Search ............. 455/67.11, 455/67.14, 456.1, 423, 115.1, 115.2, 226.1; 235/451, 492
See application file for complete search history.

(56) References Cited

U.S. PATENT DOCUMENTS

| | | | | |
|---|---|---|---|---|
| 6,317,085 B1 * | 11/2001 | Sandhu et al. | ............... | 343/702 |
| 6,477,359 B2 * | 11/2002 | Heppe et al. | ............... | 455/135 |
| 6,630,908 B2 * | 10/2003 | Gushiken | ............... | 343/702 |
| 6,657,214 B1 * | 12/2003 | Foegelle et al. | ............ | 250/506.1 |
| 6,943,739 B1 * | 9/2005 | Rousu et al. | ............... | 343/702 |
| 7,020,443 B2 * | 3/2006 | Talvitie et al. | ............. | 455/67.14 |
| 7,174,132 B2 * | 2/2007 | Lilja et al. | ............... | 455/67.11 |
| 7,205,477 B1 * | 4/2007 | Gilliland et al. | ........... | 174/74 R |
| 7,218,275 B2 * | 5/2007 | Han | ...................... | 342/357.02 |
| 7,233,076 B2 * | 6/2007 | Matsuki et al. | ............. | 257/795 |
| 7,249,302 B2 * | 7/2007 | Maltseff et al. | ............. | 714/733 |
| 7,286,802 B2 * | 10/2007 | Beyme et al. | ............ | 455/67.14 |
| 7,500,610 B1 * | 3/2009 | Hadley et al. | ............... | 235/451 |
| 2001/0023176 A1 * | 9/2001 | Talvitie et al. | ............. | 455/67.4 |
| 2001/0048714 A1 * | 12/2001 | Jha | ............................ | 375/150 |
| 2003/0169205 A1 * | 9/2003 | Gioia et al. | ................. | 343/702 |
| 2004/0162086 A1 * | 8/2004 | Han | ........................ | 455/456.1 |

(Continued)

FOREIGN PATENT DOCUMENTS

JP         2003-76946         3/2003

OTHER PUBLICATIONS

"Omnidirectional low VSWR antenna for FCC-approved UWB frequency band" Institute of Electronics, Information and Communications Engineers, Takuya, Taniguchi, Takehiko Kobayashi, Tokyo Denki University, B-1-133, B201, Mar. 22, 2003.

(Continued)

*Primary Examiner*—Minh D Dao
(74) *Attorney, Agent, or Firm*—Staas & Halsey LLP

(57) ABSTRACT

The present invention discloses a method of manufacturing an electronic apparatus for wireless communications in that the method includes the steps of arranging an antenna apparatus adjacent to the electronic apparatus formed on a substrate and testing the electronic apparatus by conducting the wireless communications between the electronic apparatus and the antenna apparatus.

9 Claims, 8 Drawing Sheets

U.S. PATENT DOCUMENTS

2005/0206570 A1* 9/2005 Rousu et al. ............... 343/702
2005/0224970 A1* 10/2005 Matsuki et al. ............ 257/737
2006/0290496 A1* 12/2006 Peeters .................... 340/572.1
2008/0180326 A1* 7/2008 Chen .................... 343/700 MS
2008/0290967 A1* 11/2008 Tong et al. ................ 333/175
2009/0109002 A1* 4/2009 Hadley et al. ............. 340/10.1
2009/0154427 A1* 6/2009 Lee et al. ................... 370/335

OTHER PUBLICATIONS

Communication from the Japanese Patent Office mailed on Jul. 6, 2010 in the related Japanese patent application No. 2006-091604.

* cited by examiner

ELECTRONIC APPARATUS AND METHOD OF MANUFACTURING ELECTRONIC APPARATUS

BACKGROUND OF THE INVENTION

1. Field of the Invention

The present invention generally relates to an electronic apparatus and a method of manufacturing an electronic apparatus, and more particularly to an electronic apparatus mounted on a substrate for performing wireless communications and a method of manufacturing the electronic apparatus.

2. Description of the Related Art

In recent years and continuing, a wireless communication technology using UWB (Ultra Wide Band) is drawing attention for achieving radar positioning and large transmission capacity communications. Since 2002, the UWB has been approved for the use of a frequency band ranging from 3.1 to 10.6 GHz by the U.S. FCC (Federal Communications Commission).

Since the UWB is a communication method communicating pulse signals in an ultra wide band, the antenna used for the UWB is to have a configuration that can perform communications in an ultra wide band.

As an antenna for performing communications at least in the FCC-approved 3.1-10.6 GHz band, an antenna having a ground plate and a feed member is proposed ("Omnidirectional low VSWR antenna for FCC-approved UWB frequency band" Institute of Electronics, Information, and Communications Engineers, Takuya Taniguchi, Takehiko Kobayashi (Tokyo Denki University), B-1-133, (Mar. 22, 2003, B201)).

Conventionally, the wireless communication operation of an RF tag is tested by, for example, passing the RF tag through a reading device after the manufacturing of the RF tag is completed. The wireless communication performance of the RF tag cannot be tested during the process of manufacturing the RF tag. Furthermore, an RF tag is discarded when it is determined to be defective after the manufacturing of the RF tag is completed. This step of discarding a completed RF tag is unnecessary, if it is known that the completed RF tag is defective before completing the manufacturing of the RF tag.

SUMMARY OF THE INVENTION

The present invention may provide an electronic apparatus and a method of manufacturing an electronic apparatus that substantially obviate one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by an electronic apparatus and a method of manufacturing the electronic apparatus particularly pointed out in the specification in such full, clear, concise, and exact terms as to enable a person having ordinary skill in the art to practice the invention.

To achieve these and other advantages and in accordance with the purpose of the invention, as embodied and broadly described herein, an embodiment of the present invention provides a method of manufacturing an electronic apparatus for wireless communication, the method including the steps of: arranging an antenna apparatus adjacent to the electronic apparatus formed on a substrate; and testing the electronic apparatus by conducting the wireless communication between the electronic apparatus and the antenna apparatus.

In the method of manufacturing an electronic apparatus according to an embodiment of the present invention, the antenna apparatus may be severed from the substrate after the testing of the electronic apparatus.

In the method of manufacturing an electronic apparatus according to an embodiment of the present invention, plural of the electronic apparatuses may be formed on the substrate, wherein the plural electronic apparatuses are severed from the substrate after the testing of the electronic apparatuses.

In the method of manufacturing an electronic apparatus according to an embodiment of the present invention, the electronic apparatus may be formed by forming a conductive pattern on the substrate.

In the method of manufacturing an electronic apparatus according to an embodiment of the present invention, the antenna apparatus may be arranged in correspondence with the directivity of the wireless communication of the electronic apparatus.

In the method of manufacturing an electronic apparatus according to an embodiment of the present invention, the electronic apparatus may include an antenna part, wherein the antenna apparatus is arranged adjacent to the antenna part of the electronic apparatus.

In the method of manufacturing an electronic apparatus according to an embodiment of the present invention, plural of the electronic apparatuses may be formed on the substrate in a proportion where a single antenna apparatus is arranged in correspondence with a predetermined number of electronic apparatuses.

In the method of manufacturing an electronic apparatus according to an embodiment of the present invention, plural of the electronic apparatuses may be formed on the substrate, wherein the electronic apparatuses are tested by conducting wireless communication with one another.

Furthermore, another embodiment of the present invention provides an electronic apparatus including: an electronic device manufactured by using the method of the present invention.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
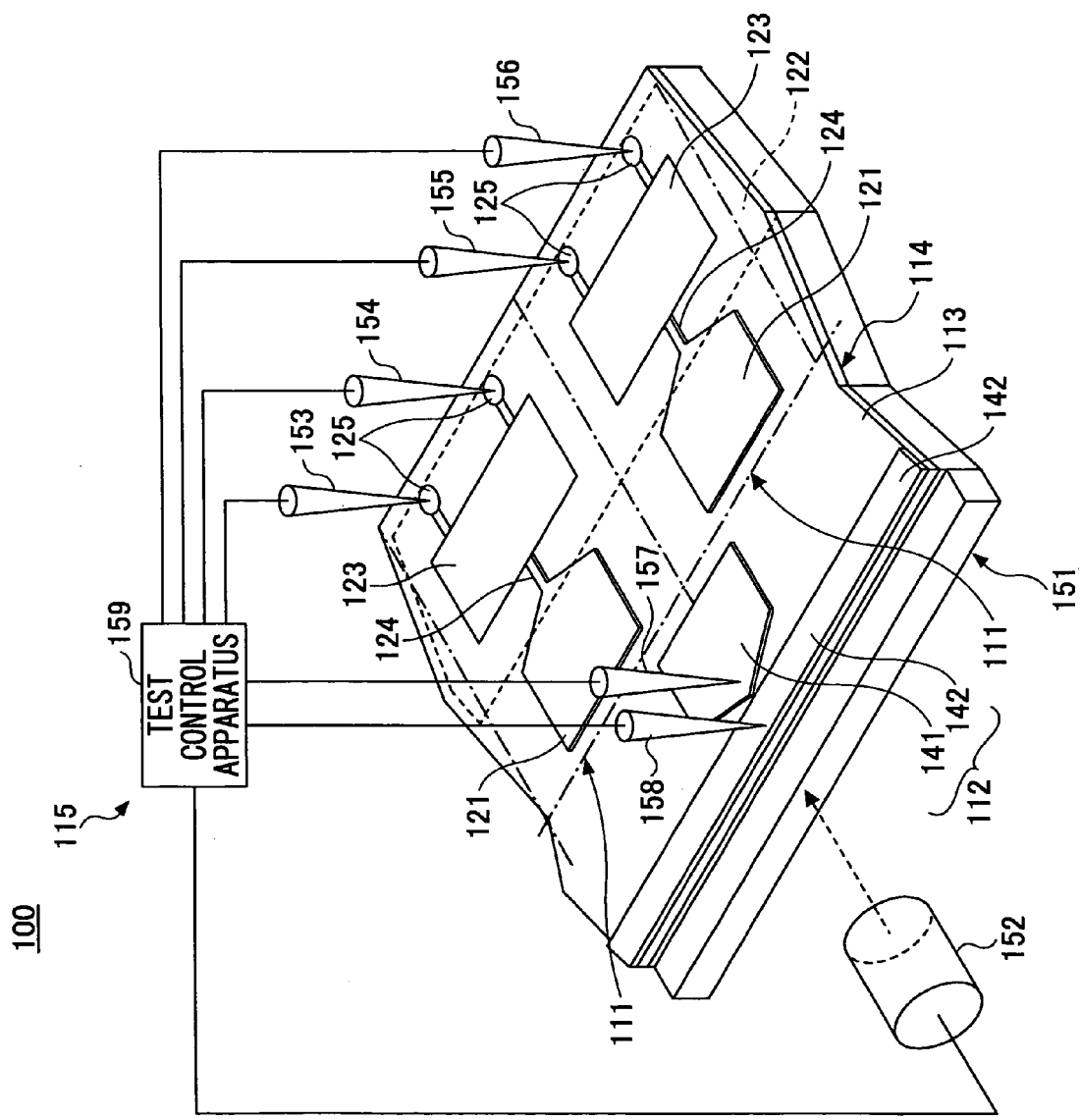
FIG. 1 is a schematic diagram showing a configuration of a testing system according to an embodiment of the present invention.

FIG. 1 is a schematic diagram showing a configuration of a testing system 100 according to an embodiment of the present invention.

The testing system 100 is for testing the wireless communication operation of one or more electronic apparatuses (electronic devices) 111 in a process of manufacturing the electronic apparatuses 111. The testing of the electronic apparatuses 111 is conducted by connecting a testing apparatus 115 to a circuit board 114 including a printed wiring board 113 on which plural electronic apparatuses 111 and plural test antenna apparatuses 112 are formed.

Figure 2:
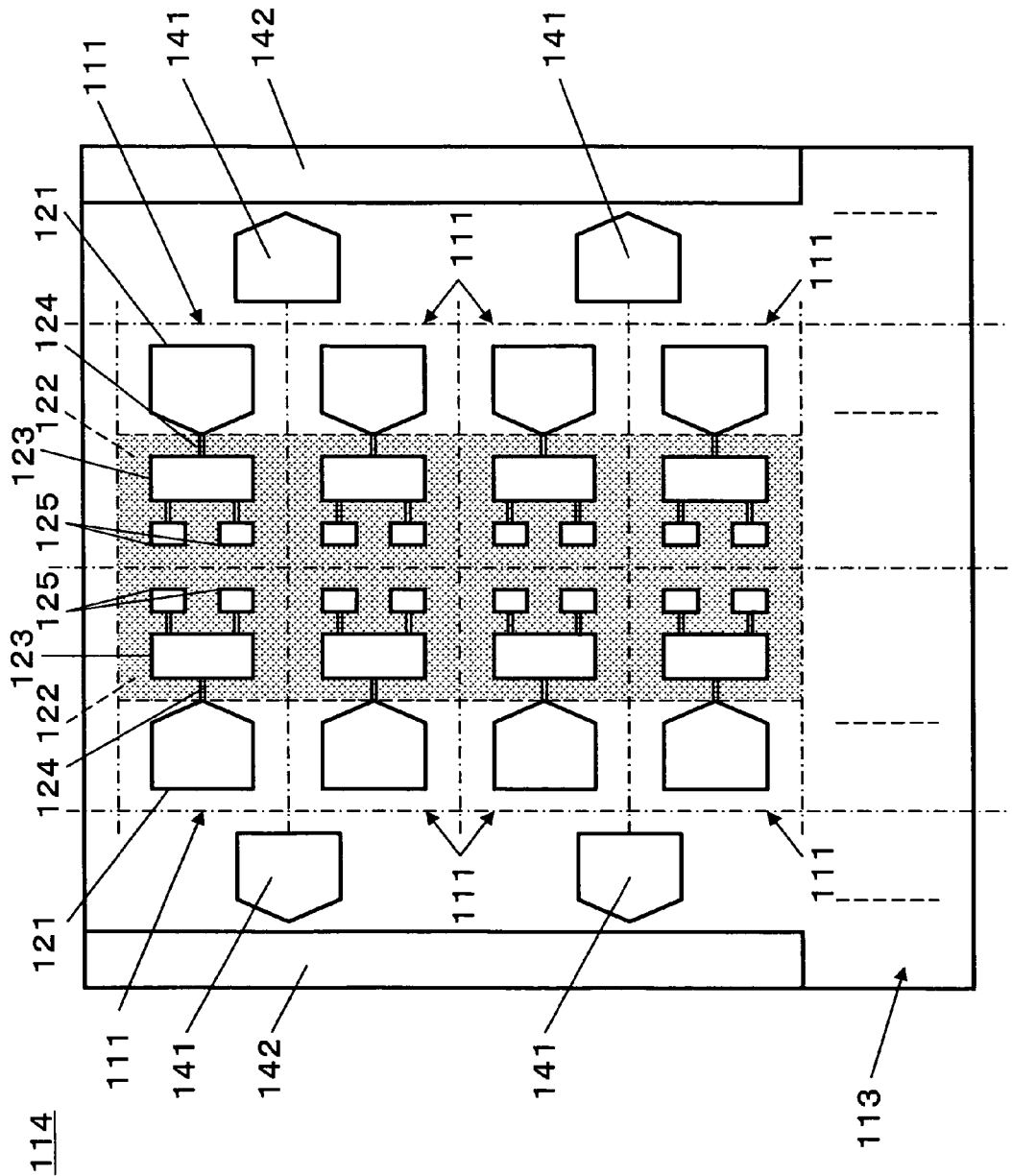
FIG. 2 is a plan view of a circuit board according to an embodiment of the present invention.

FIG. 2 is a plan view of the circuit board 114 according to an embodiment of the present invention.

After the testing is finished, respective electronic apparatuses 111 are severed from the circuit board 114 by cutting the circuit board 114.

The printed wiring board 113 of the circuit board 114 includes, for example, FR-4 and ceramics. A conductive pattern is formed on the printed wiring board 113.

In this example, each electronic apparatus 111 formed on the printed wiring board 113 includes an element pattern 121, a ground pattern 122, a circuit part 123, a transmission line 124, and a power supply connection pad(s) 125. The element pattern 121 is formed on the circuit board 114 in a manner facing outward from the printed wiring board 113.

The element pattern 121, the ground pattern 122, the transmission line 124, and the power supply connection pad 125 form the conductive pattern of the printed wiring board 113.

The element pattern 121 is formed on the surface of the electronic apparatus 111 covering substantially half the area of the electronic apparatus 111 on one side (front side) of the printed wiring board 113. In this example, the element pattern 111 has a shape similar to a home plate, that is, a pentagonal shape having an isosceles triangle added to the long side of a rectangle. The apex between the two equilateral sides of the isosceles triangle is a feed point P0 of the element pattern 121. The ground pattern 122 is formed on the other half area of the electronic apparatus 111 (opposite to the area on which the element pattern 121 is formed) on the other side (back side) of the printed wiring board 113. Among the four sides of the ground pattern 122, the side which is situated toward the element pattern 121 is formed to contact the feed point P0 of the element pattern 121 via the printed wiring board 113.

The feed point P0 of the element pattern 121 is connected to the circuit part 123 via the transmission line 124. The transmission line 124 is configured to form a microstrip line together with the ground pattern 122. It is to be noted that the configuration of the ground pattern 122 and the transmission line 124 may also be formed having a coplanar structure.

Figure 3:
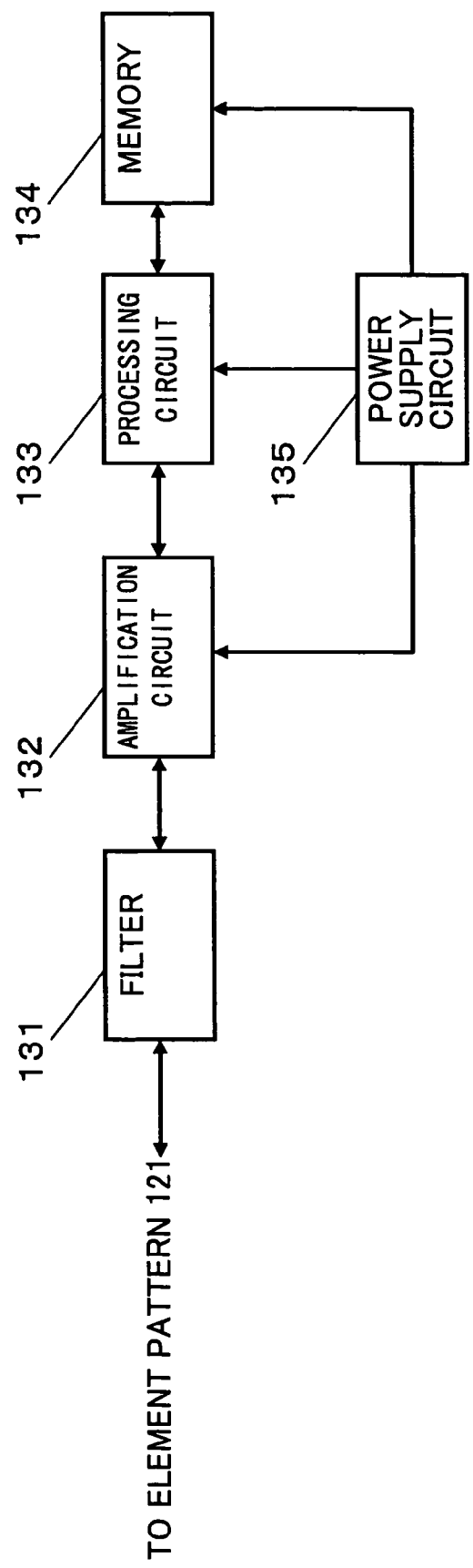
FIG. 3 is a block diagram showing an exemplary configuration of a circuit part according to an embodiment of the present invention.

FIG. 3 is a block diagram showing an exemplary configuration of the circuit part 123 according to an embodiment of the present invention.

The circuit part 123 includes, for example, a filter 131, an amplification circuit 132, a processing circuit (processing part) 133, a memory 134, and a power supply circuit 135.

The filter 131 includes, for example, a wide bandpass filter that removes signals from an undesired band. In order for the filter 131 to serve as a wide bandpass filter, plural levels of ring filters and stubs are provided by forming a conductive pattern on the printed wiring board 113.

The amplification circuit 132 is connected between the filter 131 and the processing circuit 133 for amplifying communication signals including transmitted signals and received signals. The processing circuit 133 performs conversion between communication signals and communication data for sending an ID in response to an ID request from outside. The memory 134, which holds one or more IDs, reads out an ID according to a request from the processing circuit 133.

The power supply circuit 135 generates driving power from the power supplied to the connection pad 125 and sends the generated driving power to the amplification circuit 132, the processing circuit 133, and the memory 134. The connection pad 125 is connected to a probe during the testing of the electronic apparatus 100, and is connected to a battery when the manufacturing of the electronic apparatus 100 is completed.

Next, an operation of the processing circuit 133 is described.

Figure 4:
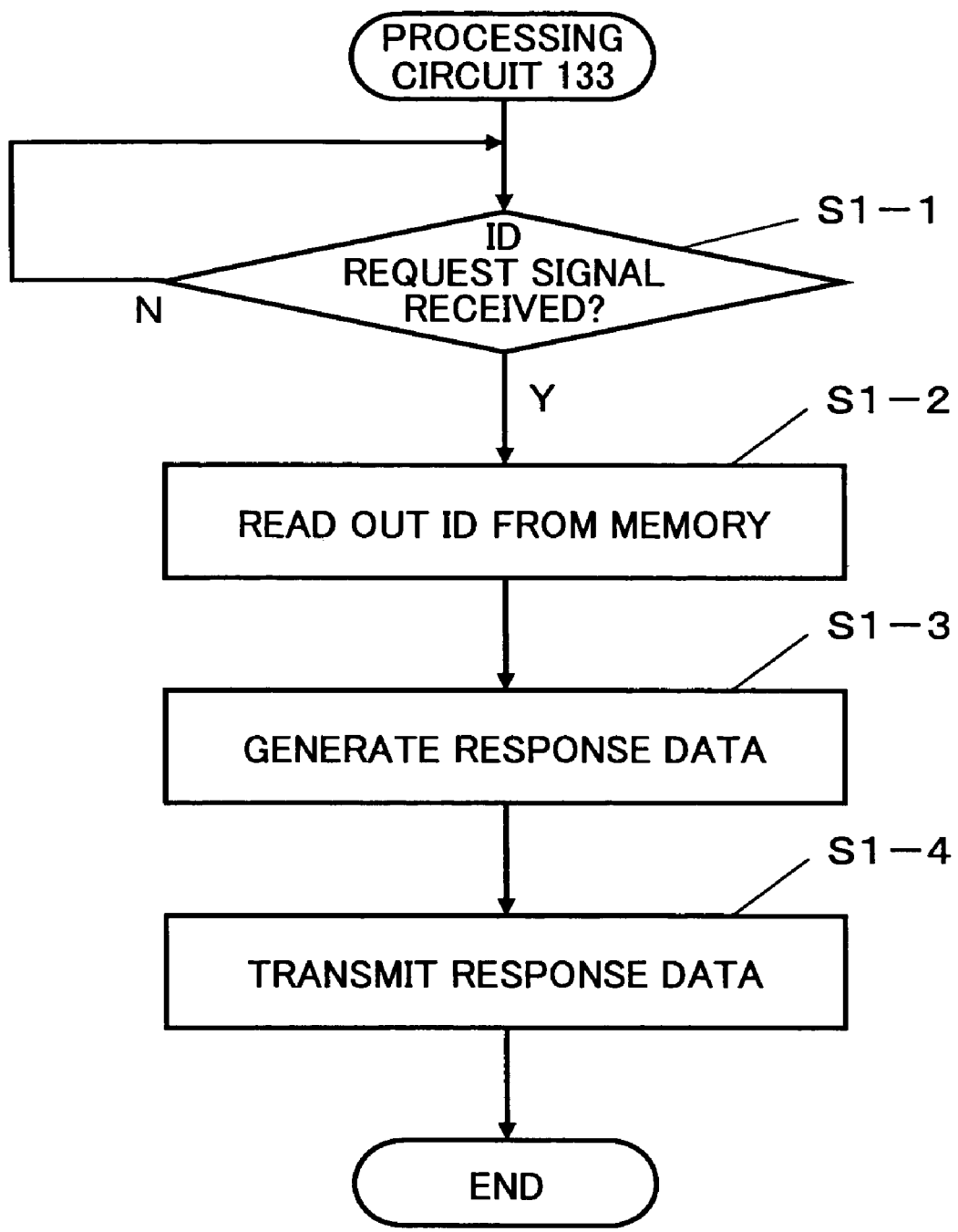
FIG. 4 is a flowchart showing an operation of a processing circuit (processing part) according to an embodiment of the present invention.

FIG. 4 is a flowchart showing an operation of the processing circuit (processing part) 133 according to an embodiment of the present invention.

In a case where the processing circuit 133 receives a signal requesting for an ID (ID request signal) (Yes in Step S1-1), the processing circuit 133 reads out an ID from the memory 134 (S1-2).

Then, the processing circuit 133 generates response data including the read out ID (S1-3).

Then, the processing circuit 133 transmits the response data (S1-4).

Plural test antenna apparatuses 112 are provided at the peripheral edge parts of the printed wiring board 113 in a proportion where a single test antenna apparatus 112 is formed in correspondence with two electronic apparatuses 111. For example, the test antenna apparatuses 112 are arranged so that the center of each test antenna apparatus 112 is positioned between two electronic apparatuses 111. This allows a single test antenna apparatus 112 to test the wireless communications of two electronic apparatuses 111.

The test antenna apparatus 112 includes an element pattern 141 and a ground pattern 142. The element pattern 141 is formed on one side (front side) of the printed wiring board 113. The element pattern 141 also has a shape similar to a home plate, that is, a pentagonal shape having an isosceles triangle added to the long side of a rectangle. The apex between the two equilateral sides of the isosceles triangle is the feed point P0 of the element pattern 141. The element pattern 141 is formed on the circuit board 114 so that the feed point P0 of the element pattern 141 faces outward of the printed wiring board 113.

The ground pattern 142 is formed on the outer peripheral side of the element pattern 141 of the printed wiring board 113. The ground pattern 142 is formed on the same side (front side) of the printed wiring board 121 as the side on which the element pattern 141 of the printed wiring board 121 is formed. Among the four sides of the ground pattern 142, the inward side of the ground pattern 142 is disposed facing the feed point P0 of the element pattern 141. It is to be noted that the element pattern 141 and the ground pattern 142 are not connected, that is, the element pattern 141 and the ground pattern 142 are insulated from each other.

Figure 5:
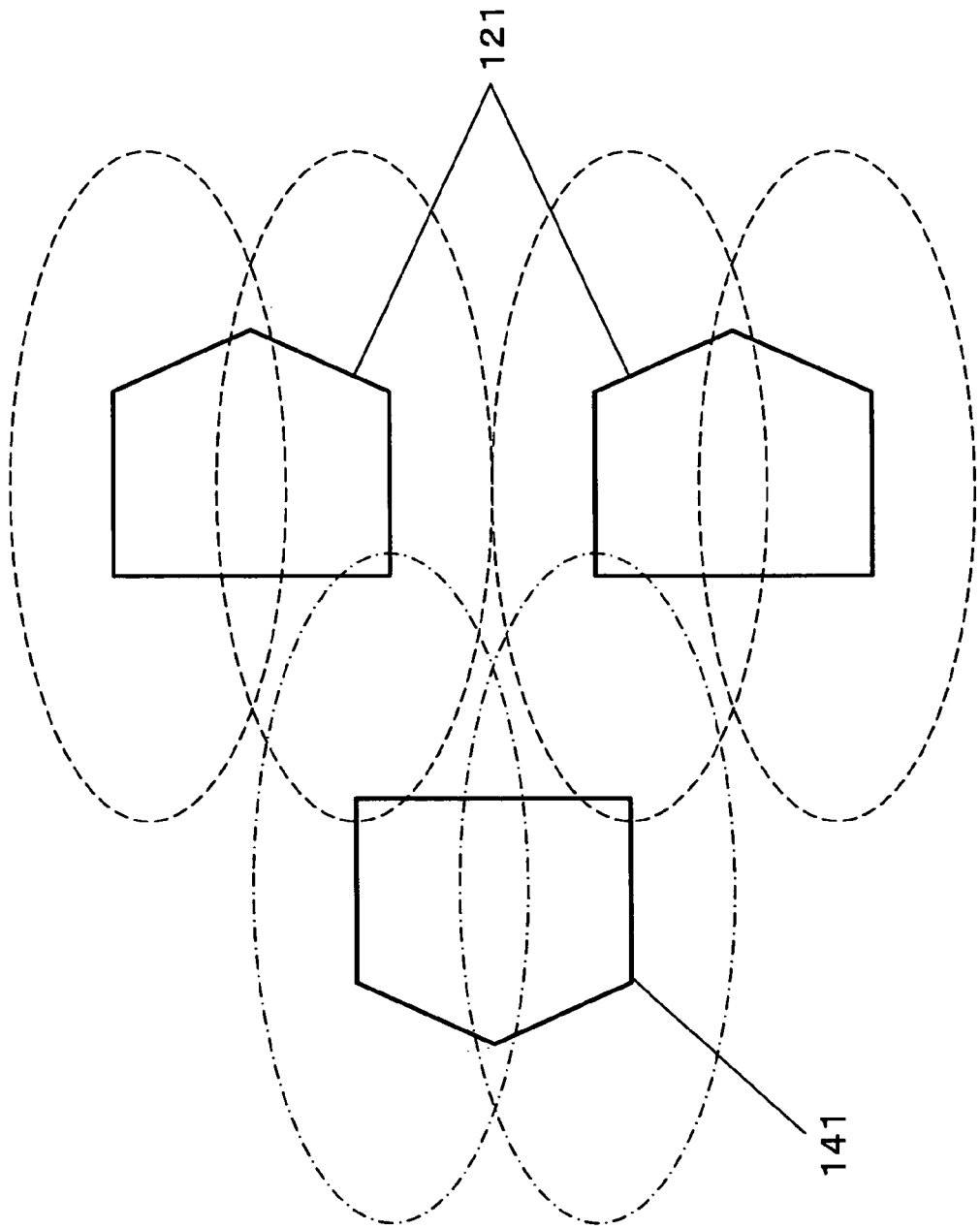
FIG. 5 is a schematic diagram for describing the directivity of element patterns (antenna patterns) according to an embodiment of the present invention.

FIG. 5 is a schematic diagram for describing the directivity of the element patterns (antenna patterns) 121, 141 according to an embodiment of the present invention.

In FIG. 5, the directivity of the element pattern 121 is illustrated with broken lines, and the directivity of the element pattern 141 is illustrated with dash-dot lines. For example, the property of the directivity of the element patterns 121, 141 is similar to a cross section of an apple where the directivity becomes smaller at a central area and larger at a peripheral area.

Accordingly, by arranging the element pattern 141 between two element patterns 121, the part of the element pattern 141 having strong directivity matches the part of the element pattern 121 having strong directivity as shown in FIG. 5. Accordingly, communications between the element pattern 121 and the element pattern 141 can be conducted efficiently.

Next, the testing apparatus 115 according to an embodiment of the present invention is described.

Figure 6:
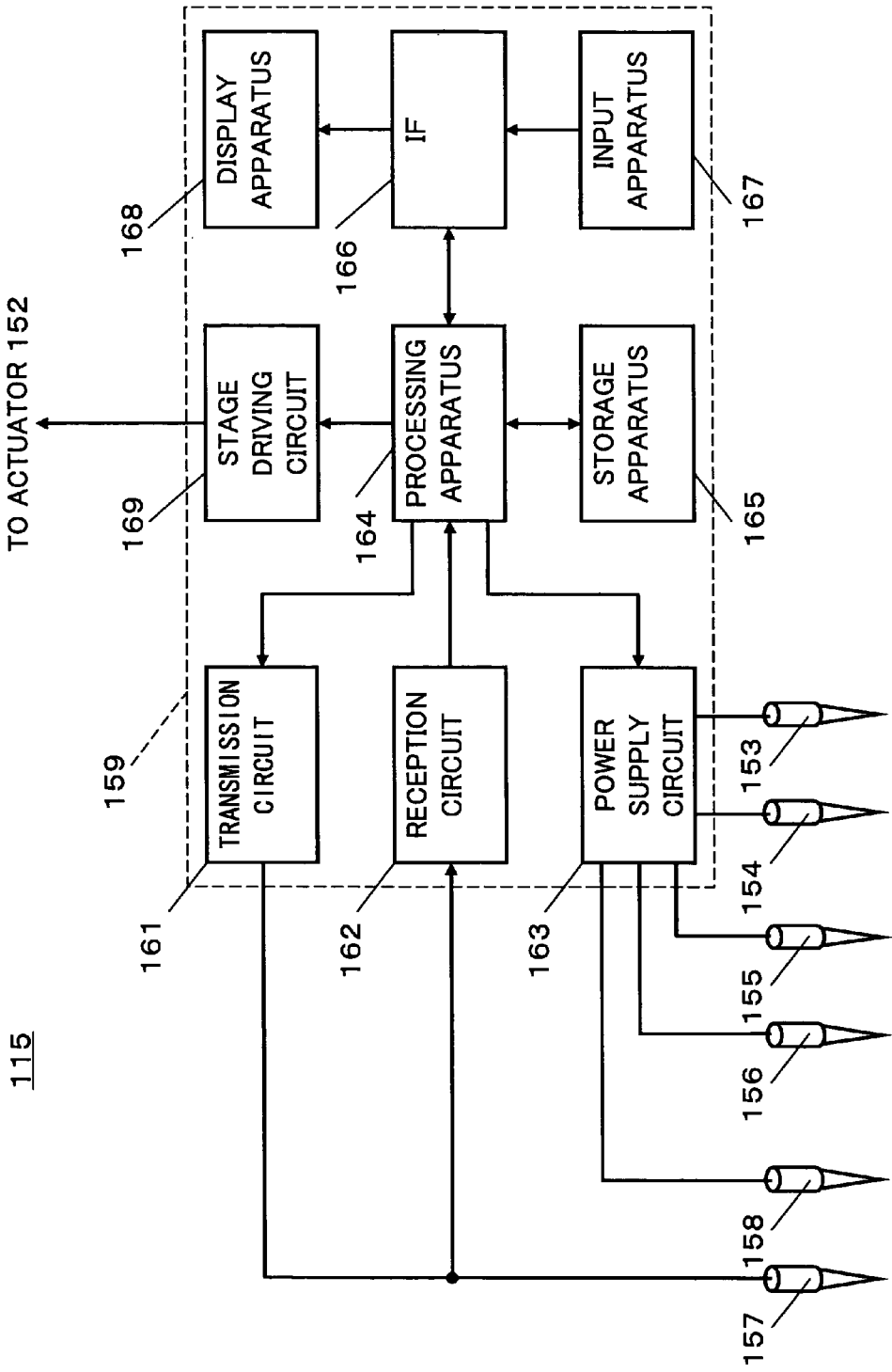
FIG. 6 is a block diagram showing an exemplary configuration of a testing apparatus according to an embodiment of the present invention.

FIG. 6 is a block diagram showing an exemplary configuration of the testing apparatus 115.

The testing apparatus 115 includes, for example, a stage 151, an actuator 152, plural probes 153-158, and a test control apparatus 159 (see FIGS. 1 and 6).

The test control apparatus 159 includes, for example, a transmission circuit 161, a reception circuit 162, a power supply circuit 163, a processing apparatus 164, a storage apparatus 165, an interface circuit 166, an input apparatus 167, a display apparatus 168, and a stage driving circuit 169.

The circuit board 114 having plural electronic apparatuses 111 (testing targets) formed thereon is mounted on the stage 151. The stage 151 can be moved (transported) by the actuator 152. The actuator 152 moves the stage 151 in accordance with the commands from the test control apparatus 159 so that the probes 153-158 contact corresponding parts of the circuit board 114 including the power supply connection pads 125 of the electronic apparatuses 111 and the element pattern 141 and the ground pattern 142 of the test antenna apparatus 112.

The probes 153-156 are connected to the power supply connection pads 125 of the electronic apparatuses 111 for supplying power to the circuit parts 123 of the electronic apparatuses 111.

The probe 157 is connected to the feed point P0 of the element pattern 141 of the test antenna apparatus 112 for sending transmission signals from the transmission circuit 161 to the element pattern 141 and sending reception signals from the element pattern 141 to the reception circuit 162. The probe 158 is connected to the ground pattern 142 for making the ground pattern 142 have ground potential.

The transmission circuit 161 generates transmission signals from the transmission data of the processing apparatus 164 and sends the transmission signals to the element pattern 141 via the probe 157.

The reception circuit 162 generates reception data from the reception signals sent from the element pattern 141 via the probe 157 and sends the reception data to the processing apparatus 164.

The power supply circuit 163 generates power supply voltage for driving the electronic apparatus 111 in accordance with the commands from the processing apparatus 164 and supplies the generated power supply voltage to the electronic elements 111 via the probes 153, 154.

During the operation of testing the electronic apparatuses 111, the processing apparatus 164 generates transmission data, sends the transmission data to the transmission circuit 161, and determines the status of the electronic apparatuses 111 based on the reception data received from the reception circuit 162. The storage apparatus 165 includes, for example, a hard disk drive, a memory, or a commutative type disk drive. The storage apparatus 165 is for providing a testing program to the processing apparatus 164. Furthermore, the storage apparatus 165 is also used as a work memory space of the processing apparatus 164.

The interface circuit 166 serves as an interface for the processing apparatus 164, the input apparatus 167, and the display apparatus 168. The input apparatus 167 includes human interfaces (user interfaces) such as a mouse and/or a keyboard which are used for, for example, giving various instructions (e.g. initiation of testing operation) and setting various testing conditions. The display apparatus 168 includes a CRT or an LCD for displaying, for example, status of the testing operation or the test results.

The stage driving circuit 169 drives the movement (transportation) of the stage 151 in accordance with the commands from the processing apparatus 164 so that predetermined parts of the circuit board 114 are positioned at predetermined locations corresponding to the probes 153-158.

Next, an operation of the processing apparatus included in the test control apparatus 159 according to an embodiment of the present invention is described.

Figure 7:
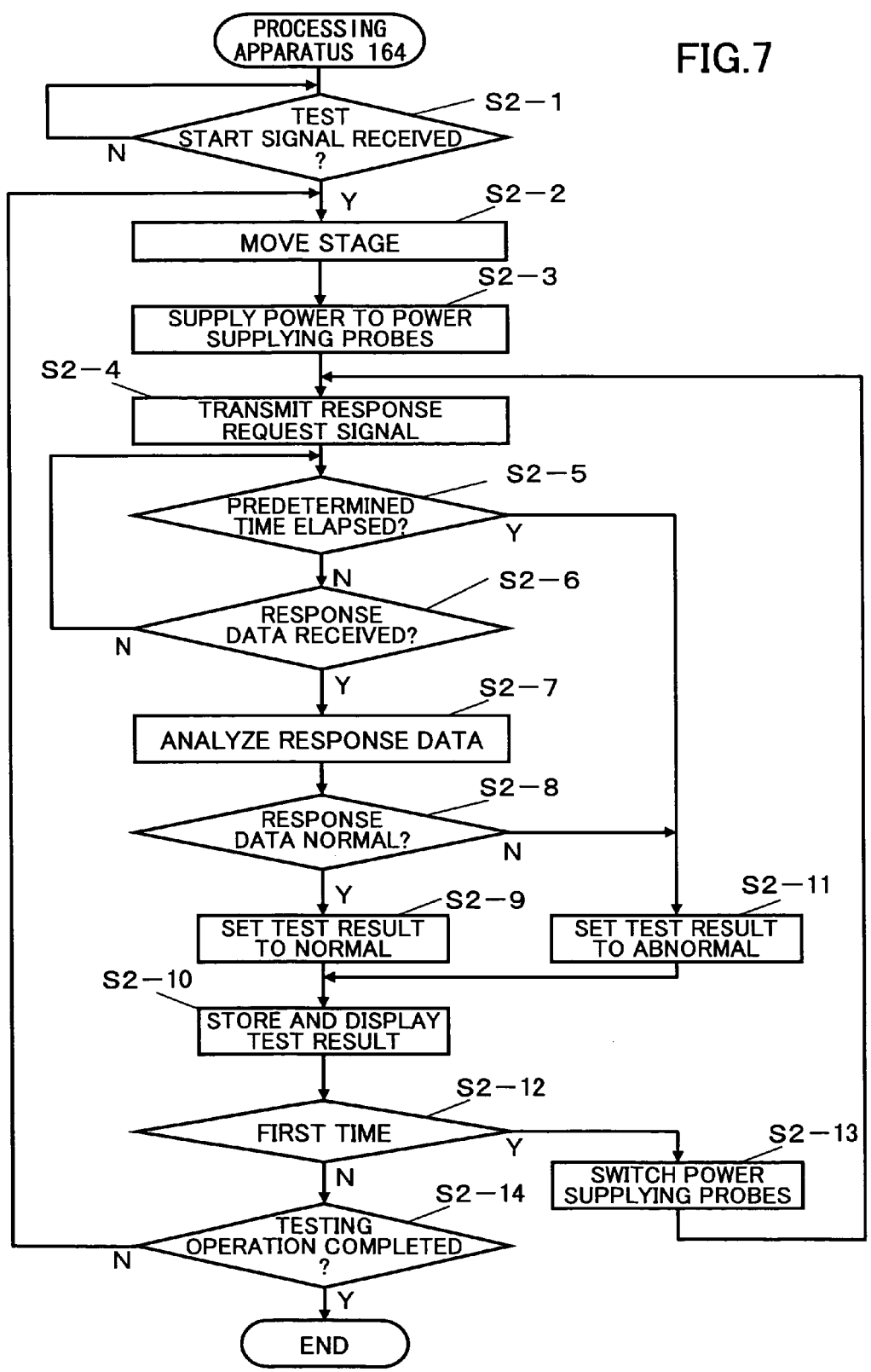
FIG. 7 is a flowchart for describing an operation of a processing apparatus according to an embodiment of the present invention.

FIG. 7 is a flowchart for describing the operation of the processing apparatus 164.

After the circuit board 114 is mounted on the stage 151, the processing apparatus 164 waits for a command (signal) to start a testing operation from the input apparatus 167 in Step S2-1. When the processing apparatus 164 receives the command to start the testing operation from the input apparatus 167 (Yes in Step S2-1), the processing apparatus 164 drives the actuator 152 so that the stage 151 is moved to a position enabling the probes 153-158 to contact the power supply connection pads 125 of the electronic apparatuses 111 and the element pattern 141 and the ground pattern 142 of the testing apparatuses 112 (Step S2-2).

Then, the processing apparatus 164 controls the power supply circuit 163 for supplying driving power to the electronic apparatuses 111 via the probes 153, 154 (Step S2-3). It is to be noted that the driving power is not to be supplied to the probes 155, 156.

The processing apparatus 164 controls the transmission circuit 161 for sending transmission signals (response request signals) to the probe 157 (Step S2-4).

The transmission signals are sent to the element pattern 141 via the probe 157. In accordance with the transmission signals, the element pattern 141 emits transmission radio waves. The transmission radio waves emitted from the element pattern 141 are received by the element patterns 121 of the electronic apparatuses 111. In response to the transmission signals sent from the testing apparatus 115 via the probe 157, the electronic apparatuses 111 generate response data and send the generated response data (reception signals) from their element patterns 121.

When the response data sent from the electronic apparatuses 111 reach the element pattern 141 of the test antenna apparatus 112, the element pattern 141 of the test antenna apparatus 112 receives the response data of the electronic devices 111. The response data received by the element pattern 141 of the test antenna apparatus 112 are sent to the processing apparatus 164 via the probe 157 and the reception circuit 162.

In a case where the processing apparatus 164 receives the response data from the electronic apparatuses 111 within a predetermined period of time (No in Step S2-5 and Yes in Step S2-6), the processing apparatus 164 analyzes the received response data (Step S2-7). In a case where the response data is determined as "normal" according to the result of the analysis (Yes in Step S2-8), the processing apparatus 164 sets the test result (analysis result) of the electronic apparatuses 111 to "normal" (Step S2-9). Then, the processing apparatus 164 stores the test result in the storage apparatus 159 and displays the test result in the display apparatus 162 (Step S2-10).

On the other hand, in a case where the processing apparatus 164 does not receive the response data from the electronic apparatuses 111 within a predetermined period of time (Yes in Step S2-5) or in a case where the response data are determined as "abnormal" according to the result of the analysis (No in Step S2-8), the processing apparatus 164 sets the test result (analysis result) of the electronic apparatuses 111 to "abnormal" (Step S2-11). Then, the processing apparatus 164 stores the test result in the storage apparatus 159 and displays the test result in the display apparatus 162 (Step S2-10).

Then, after the processing apparatus 164 moves the stage 151, the processing apparatus 164 determines whether the previous testing operation is a testing operation for the first time (i.e. testing operation for a first electronic apparatus 111 of the two corresponding electronic apparatuses 111) or a testing operation for the second time (i.e. testing operation for a second electronic apparatus 111 of the two corresponding electronic apparatuses 111) (Step S2-12). In a case where the previous testing operation is a testing operation for the first time (Yes in Step S2-12), the processing apparatus 164 switches its power supplying probes from the probes 153, 154 to the probes 155, 156 (Step S2-13). Then, the operation returns to Step S2-4.

On the other hand, in a case where the previous testing operation is a testing operation for the second time (No in Step S2-12), the processing apparatus 164 determines whether the testing operation has been performed on all of the electronic apparatuses 111 formed on the circuit board 114 mounted on the stage 151 (Step S2-14). In a case where the testing of the electronic apparatuses 111 is not completed (No in Step S2-14), the operation returns to Step S2-2 for testing the remaining untested electronic apparatuses 111. In a case where the testing of the electronic apparatuses 111 is completed (Yes in Step S2-14), the operation is finished.

After the testing of electronic apparatuses 111 is finished, the circuit board 114 is cut so as to sever the electronic apparatuses 111 from each other as well as from the test antenna apparatus 112.

Figure 8:
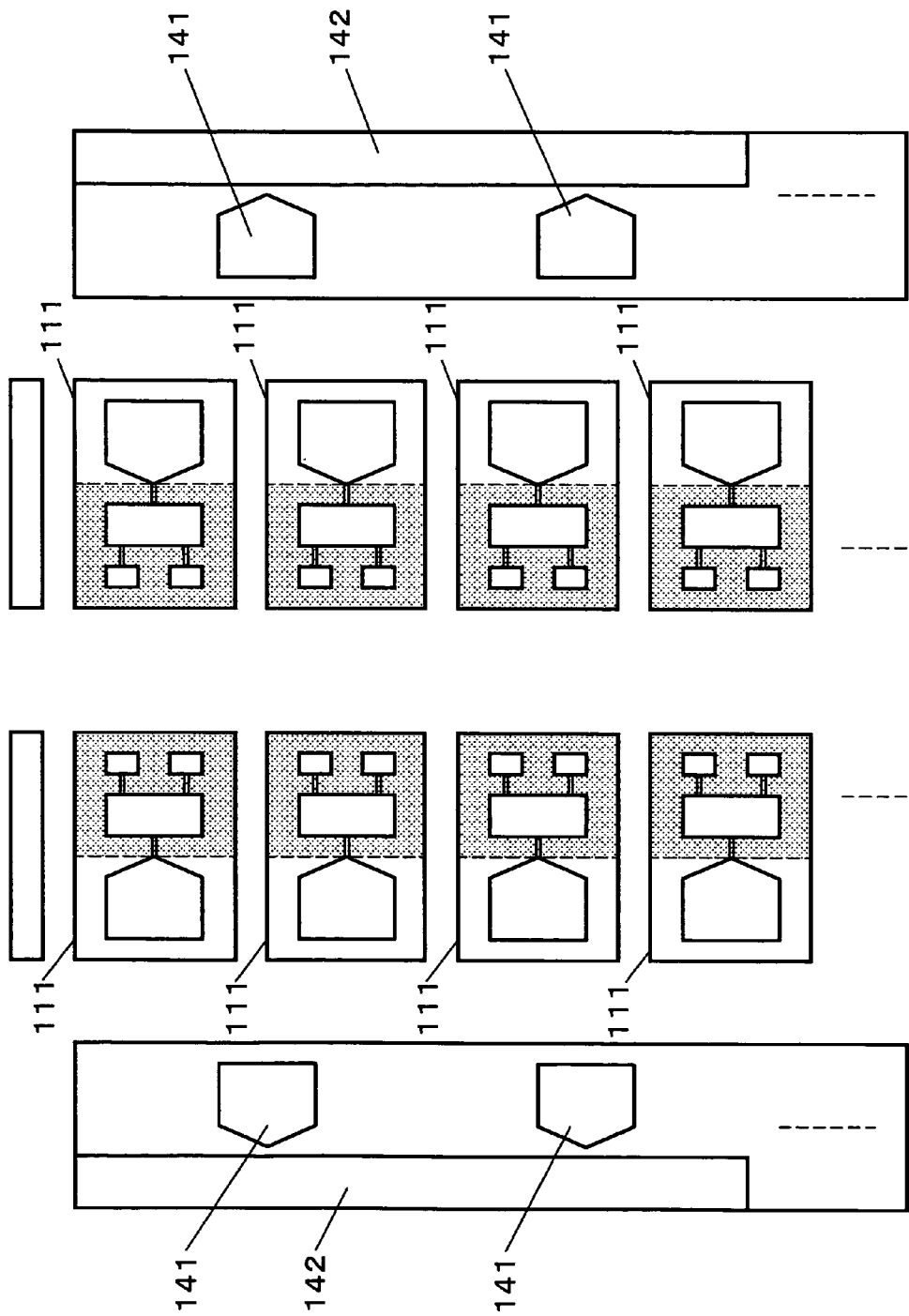
FIG. 8 is a schematic diagram for describing a severing (cutting) step in a process of manufacturing an electronic apparatus according to an embodiment of the present invention.

FIG. 8 is a schematic diagram for describing a severing (cutting) step in a process of manufacturing the electronic apparatuses 111. As shown in FIG. 8, the electronic apparatuses 111 are cut apart from the test antenna apparatus 112 after the above-described testing is completed.

With the above-described embodiment of the present invention, the operation of an electronic apparatus can be tested by forming an antenna apparatus on the same substrate as the electronic apparatus at a predetermined position adjacent to the electronic apparatus and conducting wireless communications between the antenna apparatus and the electronic apparatus. Since the electronic apparatus is tested by having the antenna apparatus and the electronic apparatus fixed to predetermined positions on the substrate, the test can be conducted accurately. Furthermore, since the test is conducted where one or more electronic apparatuses are formed on a substrate (circuit board), the manufacturing efficiency of the electronic apparatus can be improved.

Although the present invention is described above by applying the present invention to the above-described monopole type UWB antenna having a home-plate shape, the shape of the antenna is not limited to the shape of a home plate. For example, the antenna may have a meandering shape. Furthermore, the antenna is not limited to a monopole type antenna, but may also be, for example, a dipole antenna. Furthermore, the antenna is not limited to a UWB antenna, but may also be, for example, a wide band antenna or a narrow band antenna. Furthermore, the antenna of the electronic apparatus 111 may be, for example, a chip antenna. Moreover, in addition to testing the electronic apparatus by conducting wireless communications between the antenna apparatus(es) and the electronic apparatus(es), the electronic apparatuses may also be tested by conducting wireless communications with one another.

Further, the present invention is not limited to these embodiments, but variations andodifications may be made without departing from the scope of the present invention.

The present application is based on Japanese Priority Application No. 2006-091604 filed on Mar. 29, 2006, with the Japanese Patent Office, the entire contents of which are hereby incorporated by reference.

What is claimed is:

1. A method of manufacturing an electronic apparatus for wireless communication, comprising:
   forming the electronic apparatus on a substrate;
   forming an antenna apparatus on the same substrate on which the electronic apparatus is formed at a position adjacent to the electronic apparatus; and
   testing the electronic apparatus by conducting the wireless communication between the electronic apparatus and the antenna apparatus.

2. The method of manufacturing an electronic apparatus as claimed in claim 1, wherein the antenna apparatus is severed from the substrate after the testing of the electronic apparatus.

3. The method of manufacturing an electronic apparatus as claimed in claim 1, wherein plural of the electronic apparatuses are formed on the substrate, wherein the plural electronic apparatuses are severed from the substrate after the testing of the electronic apparatuses.

4. The method of manufacturing an electronic apparatus as claimed in claim 1, wherein the electronic apparatus is formed by forming a conductive pattern on the substrate.

5. The method of manufacturing an electronic apparatus as claimed in claim 1, wherein the antenna apparatus is arranged in correspondence with the directivity of the wireless communication of the electronic apparatus.

6. The method of manufacturing an electronic apparatus as claimed in claim 1, wherein the electronic apparatus includes an antenna part, wherein the antenna apparatus is arranged adjacent to the antenna part of the electronic apparatus.

7. The method of manufacturing an electronic apparatus as claimed in claim 1, wherein plural of the electronic apparatuses are formed on the substrate in a proportion where a single antenna apparatus is arranged in correspondence with a predetermined number of electronic apparatuses.

8. The method of manufacturing an electronic apparatus as claimed in claim 1, wherein plural of the electronic apparatuses are formed on the substrate, wherein the electronic apparatuses are tested by conducting wireless communication with one another.

9. An electronic apparatus comprising:
   an electronic device manufactured by using the method claimed in claim 1.

* * * * *